United States Patent
Kim et al.

(10) Patent No.: US 7,258,931 B2
(45) Date of Patent: Aug. 21, 2007

(54) SEMICONDUCTOR WAFERS HAVING ASYMMETRIC EDGE PROFILES THAT FACILITATE HIGH YIELD PROCESSING BY INHIBITING PARTICULATE CONTAMINATION

(75) Inventors: Gi-Jung Kim, Kyeonkgi-do (KR); Woo-Serk Kim, Kyeongki-do (KR); Sang-Mun Chon, Kyeongki-do (KR); Tae-Yeol Heo, Kyeongki-do (KR)

(73) Assignee: Samsung Electronics Co., Ltd. (KR)

( * ) Notice: Subject to any disclaimer, the term of this patent is extended or adjusted under 35 U.S.C. 154(b) by 440 days.

(21) Appl. No.: 10/601,475

(22) Filed: Jun. 23, 2003

(65) Prior Publication Data

US 2004/0041143 A1  Mar. 4, 2004

Related U.S. Application Data

(60) Provisional application No. 60/407,516, filed on Aug. 29, 2002.

(51) Int. Cl.
*B32B 9/00* (2006.01)
*H01L 29/06* (2006.01)

(52) U.S. Cl. .................. 428/641; 428/446
(58) Field of Classification Search .......... 428/446
See application file for complete search history.

(56) References Cited

U.S. PATENT DOCUMENTS

| | | | |
|---|---|---|---|
| 4,630,093 A | 12/1986 | Yamaguchi et al. | 357/55 |
| 5,021,862 A | 6/1991 | Ogino | 357/55 |
| 5,045,505 A | 9/1991 | Kimura | 437/249 |
| 5,110,764 A | 5/1992 | Ogino | 437/224 |
| 5,182,233 A | 1/1993 | Inoue | 437/226 |
| 5,225,235 A | 7/1993 | Yoshiharu et al. | 428/64 |
| 5,230,747 A | 7/1993 | Maejima et al. | 148/33.2 |
| 5,279,992 A | 1/1994 | Maejima et al. | 437/229 |
| 5,389,579 A | 2/1995 | Wells | 437/225 |
| 5,668,062 A | 9/1997 | Hyun et al. | 438/462 |
| 5,751,055 A | 5/1998 | Maruyama et al. | 257/618 |
| 5,882,539 A | 3/1999 | Hasegawa et al. | 216/88 |
| 5,914,053 A | 6/1999 | Masamura et al. | 216/88 |

FOREIGN PATENT DOCUMENTS

| | | |
|---|---|---|
| DE | 101 31 246 A1 | 3/2002 |
| JP | 03-177023 | 8/1991 |
| JP | 06314676 A | 11/1994 |
| KR | 2001-030567 | 4/2001 |

OTHER PUBLICATIONS

Office Action, German Application No. 103 37 757.3-33, Oct. 7, 2005), printed.
Notice to Submit Response, Korean Application No. 10-2003-0038320, Feb. 25, 2005 (+ translation).

*Primary Examiner*—Jennifer McNeil
*Assistant Examiner*—Jonathan Langman
(74) *Attorney, Agent, or Firm*—Myers Bigel Sibley & Sajovec PA

(57) ABSTRACT

Semiconductor wafers utilize asymmetric edge profiles (EP) to facilitate higher yield semiconductor device processing. These edge profiles are configured to reduce the volume of thin film residues that may form on a top surface of a semiconductor wafer at locations adjacent a peripheral edge thereof. These edges profiles are also configured to inhibit redeposition of residue particulates on the top surfaces of the wafers during semiconductor processing steps. Such steps may include surface cleaning and rinsing steps that may include passing a cleaning or rinsing solution across a wafer or batch of wafers that are held by a cartridge and submerged in the solution.

6 Claims, 4 Drawing Sheets

SEMICONDUCTOR WAFERS HAVING ASYMMETRIC EDGE PROFILES THAT FACILITATE HIGH YIELD PROCESSING BY INHIBITING PARTICULATE CONTAMINATION

REFERENCE TO PRIORITY APPLICATION

This application claims priority to U.S. Provisional Application Ser. No. 60/407,516, filed Aug. 29, 2002, the disclosure of which is hereby incorporated herein by reference.

FIELD OF THE INVENTION

The present invention relates to semiconductor wafer manufacturing methods, and more particularly, to semiconductor device manufacturing methods that utilize semiconductor wafers as substrates in high volume manufacturing processes.

BACKGROUND OF THE INVENTION

Conventional semiconductor device manufacturing methods frequently include repeated steps to deposit thin films on semiconductor wafers. In some instances, one or more of these thin films is removed using conventional etching techniques. Such etching techniques may include using a plasma during an etching step to remove a previously deposited thin film(s). Because plasma etch rates may be proportional to a distance between the thin film and a source of the plasma, it is typically advantageous that the distance between the thin film and the plasma source be uniform across an entire wafer containing the thin film thereon. Such uniform distance typically enhances the etching technique by insuring a uniform etch rate and minimizing the amount of thin film residues that are present upon completion of the etching step. Unfortunately, the volume of thin film residues present at the end of an etching step, or upon completion of a sequence of etching steps, may be significant adjacent the edge of the wafer if a profile of the edge causes the distance between a top surface of the wafer and the etching source to vary significantly. This "build-up" in thin film residue at a periphery of the wafer may result in reduced wafer yield if subsequent process steps cause a transfer of thin film particles from the residues to other portions of the top surface of the wafer. For example, a cleaning step that involves passing a cleaning solution laterally across the top and bottom surfaces of the wafer may dislodge particulates from the built-up residues and redeposit these particulates on active portions of the wafer. As will be understood by those skilled in the art, these redeposited particulates may operate as substantial defects on integrated circuit dies that are cut from the wafer at the end of a semiconductor device manufacturing process. Such defects may cause the dies to be discarded as defective during reliability testing.

Conventional techniques have been developed to manufacture semiconductor wafers having asymmetric edge profiles. For example, U.S. Pat. No. 4,630,093 discloses a wafer with an asymmetric peripheral edge with regard to a middle plane of the wafer. This asymmetric peripheral edge is used to denote the front and rear surfaces of the semiconductor wafer. In particular, FIG. 2 of the '093 patent illustrates a wafer having a peripheral edge that is in the shape of a half-round. The radius of curvature of the half-round changes in the direction of thickness. U.S. Pat. Nos. 5,021,862, 5,045,505 and 5,110,764 also disclose semiconductor wafers having asymmetric edge profiles. These edge profiles have beveled portions that are formed along circumferential edges of front and back surfaces of the wafers. The circumferential edges are described as preventing chipping during wafer handling. U.S. Pat. Nos. 5,225,235, 5,230,747 and 5,279,992 also disclose wafers having rounded and/or chamfered edges that are utilized to prevent wafer chipping.

Notwithstanding advances in semiconductor wafer processing and the conventional use of semiconductor wafers having asymmetric edge profiles, there continues to be a need for semiconductor wafer manufacturing methods that result in wafers that are less susceptible to processing defects caused by residue formation on wafer edges.

SUMMARY OF THE INVENTION

Semiconductor wafers according to embodiments of the present invention utilize asymmetric edge profiles (EP) to facilitate higher yield semiconductor device processing. These edge profiles are configured to reduce the volume of thin film residues that may form on a top surface of a semiconductor wafer at locations adjacent a peripheral edge thereof. These edges profiles are also configured to inhibit redeposition of residue particulates on the top surfaces of the wafers during semiconductor processing steps. Such steps may include surface cleaning and rinsing steps that may include passing a cleaning or rinsing solution across a wafer or batch of wafers that are held by a cartridge and submerged in the solution.

Some embodiments of the present invention include a semiconductor wafer having an asymmetric edge profile (EP2) extending between an inner edge profile (EP2$_{in}$) and an outer edge profile (EP2$_{out}$) as illustrated by FIG. 2. In FIG. 2, the reference character "t" denotes a thickness of the semiconductor wafer and the angle $\phi_1$, denotes an angle in a range between about 30° and about 85°, and more particularly in a range between about 60° and about 75°. The angle $\phi_2$ is greater than $\phi_1$ and less than about 85°, and more particularly less than about 75°. Alternatively, the angles $\phi_2$ and $\phi_1$ may be equal, as illustrated by FIG. 1. The reference character "R" denotes a radius of an arc that defines EP2$_{in}$ at a point of intersection with a top surface of the semiconductor wafer. The angle α is an acute angle that represents an angle of intersection between a bottom surface of the semiconductor wafer and a line that is tangent to the arc at a point on the outer edge profile EP2$_{out}$. Four dimensional parameters may also be specified in accordance with the following relationships: $A_1 = R(1 - \cos \phi_1)$; $A_2 = R(1 - \sin α) + (B_2 - R\cos α)\cot α$; $B_1 = R\sin \phi_1$; and $B_2 = t - R\sin \phi_1$. As illustrated by FIG. 2, the dimensional parameter $A_1$ is kept relatively small compared to the thickness of the wafer in order to reduce a volume of any thin film residue that may form on a peripheral edge of the wafer. Moreover, the contours of the edge profile EP2$_{OUT}$ facilitate a formation of a vortex adjacent the top surface of the wafer when the wafer is exposed to a laterally directed solution (e.g., cleaning, rinsing). This vortex inhibits the deposition of residue particulates on the top surface during cleaning and rinsing and thereby enhances manufacturing yields.

Other embodiments of the present invention include forming a semiconductor wafer by slicing a semiconductor ingot into at least one semiconductor wafer having a top surface and a bottom surface and then grinding a peripheral edge of the at least one semiconductor wafer to define the asymmetric edge profile (EP) illustrated by FIG. 1. A polishing step may then be performed to convert the edge profile (EP) of FIG. 1 into the edge profile (EP2) of FIG. 2. Alternatively, the step of grinding the peripheral edge may directly result in an edge profile as illustrated by FIG. 2.

DESCRIPTION OF PREFERRED EMBODIMENTS

The present invention now will be described more fully with reference to the accompanying drawings, in which a preferred embodiment of the invention is shown. This invention may, however, be embodied in many different forms and should not be construed as being limited to the embodiment set forth herein; rather, this embodiment is provided so that this disclosure will be thorough and complete, and will fully convey the scope of the invention to those skilled in the art.

Figure 1:
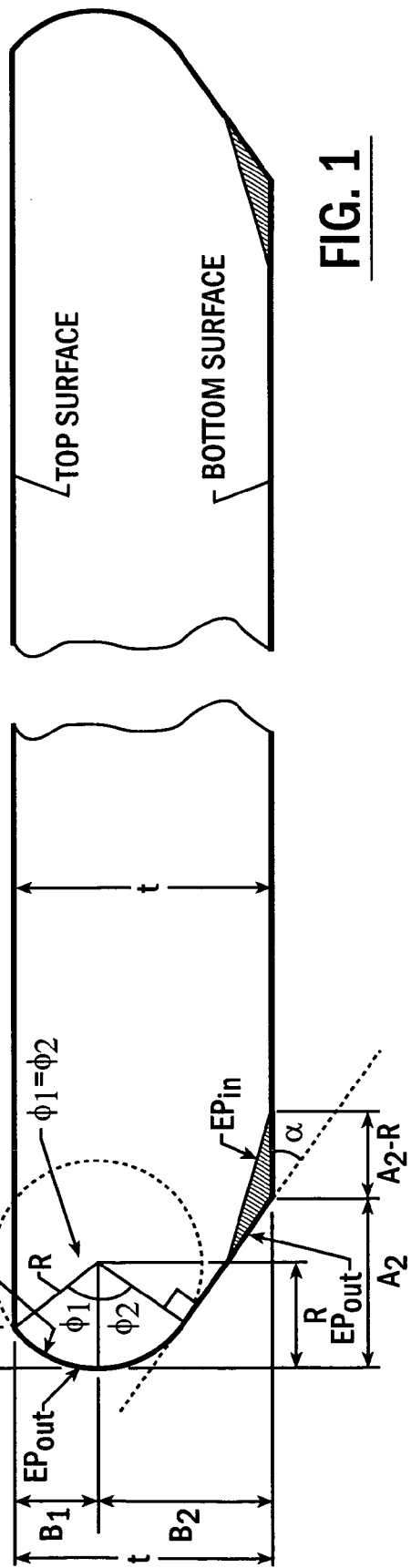
FIG. 1 is a transverse cross-sectional view of a semiconductor wafer having an asymmetric peripheral edge according to a first embodiment of the present invention.
Figure 2:
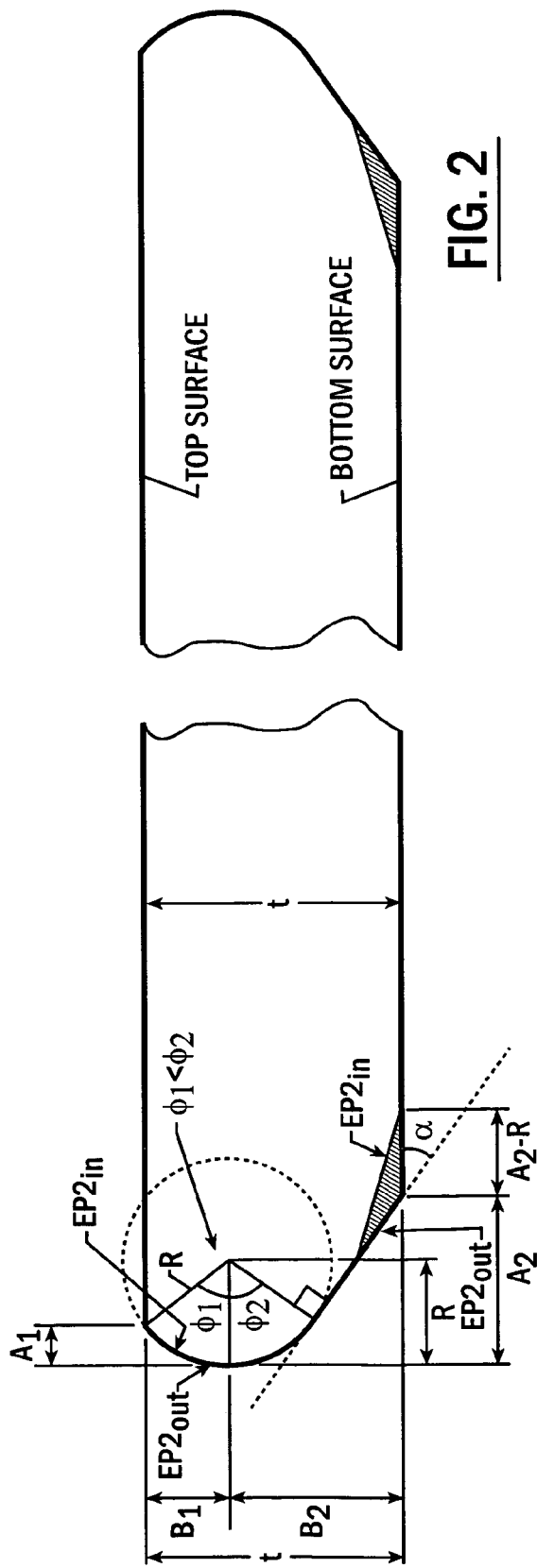
FIG. 2 is a transverse cross-sectional view of a semiconductor wafer having an asymmetric peripheral edge according to a second embodiment of the present invention.

Referring now to FIGS. 1-2, transverse cross-sectional views of semiconductor wafers according to embodiments of the present invention are illustrated. These wafers have asymmetric edge profiles (EP). In FIG. 1, the edge profile EP of a wafer extends between an inner edge profile, shown as curve $EP_{IN}$, and an outer edge profile, shown as curve $EP_{OUT}$. As illustrated, the curves $EP_{IN}$ and $EP_{OUT}$ overlap adjacent the top surface of the wafer in FIG. 1. However, the straight line portions of $EP_{IN}$ and $EP_{OUT}$ that are adjacent a bottom surface of the wafer of FIG. 1 define an innermost and outermost range of acceptable bottom edge profiles that may be entirely linear or curvilinear (e.g., piecewise curvilinear), for example. This range is illustrated with shading in FIGS. 1-2. The reference character "t" also denotes a thickness of the semiconductor wafer and the angle $\phi_1$ denotes an angle in a range between about 30° and about 85°, and more particularly in a range between about 60° and about 75°. The angle $\phi_2$ is greater than $\phi_1$ and less than about 85°, and more particularly less than about 75°. Alternatively, the angles $\phi_2$ and $\phi_1$ may be equal, as illustrated by FIG. 1. The reference character "R" denotes a radius of an arc that defines $EP_{in}$ in FIG. 1 ($EP2_{in}$ in FIG. 2) at a point of intersection with a top surface of the semiconductor wafer. The angle $\alpha$ is an acute angle that represents an angle of intersection between a bottom surface of the semiconductor wafer and a line that is tangent to the arc at a point on the outer edge profile $EP_{out}$ in FIG. 1 or $EP2_{out}$ of FIG. 2. Four dimensional parameters may also be specified in accordance with the following relationships: $A_1=R(1-\cos \phi_1)$; $A_2=R(1-\sin \alpha)+(B_2-R\cos \alpha)\cot\alpha$; $B_1=R\sin \phi_1$; and $B_2=t-R\sin \phi_1$. As illustrated by FIGS. 1-2, the dimensional parameter $A_1$ is kept relatively small compared to the thickness of the wafer in order to reduce a volume of any thin film residue that may form on a peripheral edge of the wafer. In some embodiments, the wafer thickness t is in a range between about 625 μm and about 825 μm and the arc radius R is in a range between about 0.23t and about 0.5t. The dimension $A_2$ is also preferably greater than about two times $A_1$ in some embodiments.

According to preferred aspects of these embodiments, the contours of the edge profile $EP_{OUT}$ in FIG. 1 or $EP2_{OUT}$ in FIG. 2 facilitate a formation of a vortex adjacent the top surface of the wafer when the wafer is exposed to a laterally directed solution (e.g., cleaning, rinsing) during semiconductor device manufacturing processes. This vortex provides a barrier layer that inhibits the deposition of residue particulates on the top surface during cleaning and rinsing and thereby enhances manufacturing yields.

Figure 3A:
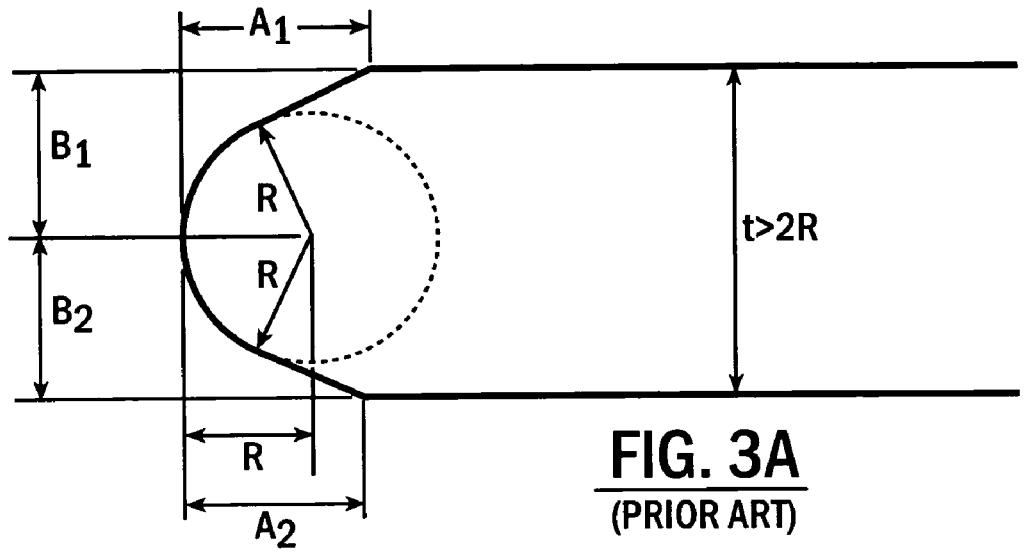
FIG. 3A is a transverse cross-sectional view of a portion of a semiconductor wafer having a symmetric peripheral edge according to the prior art.
Figure 3B:
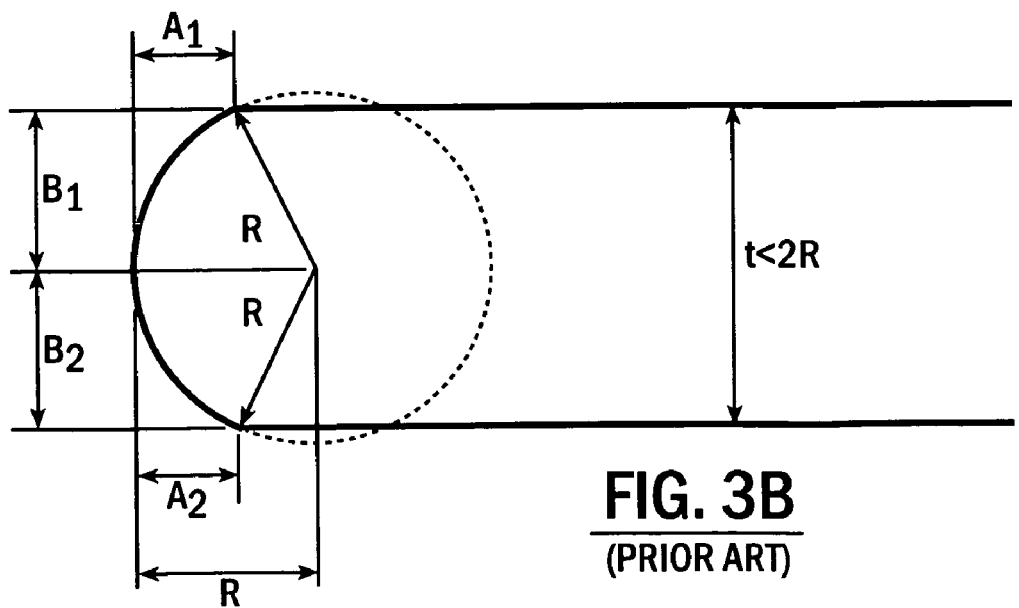
FIG. 3B is a transverse cross-sectional view of a portion of a semiconductor wafer having a symmetric peripheral edge according to the prior art.
Figure 4A:
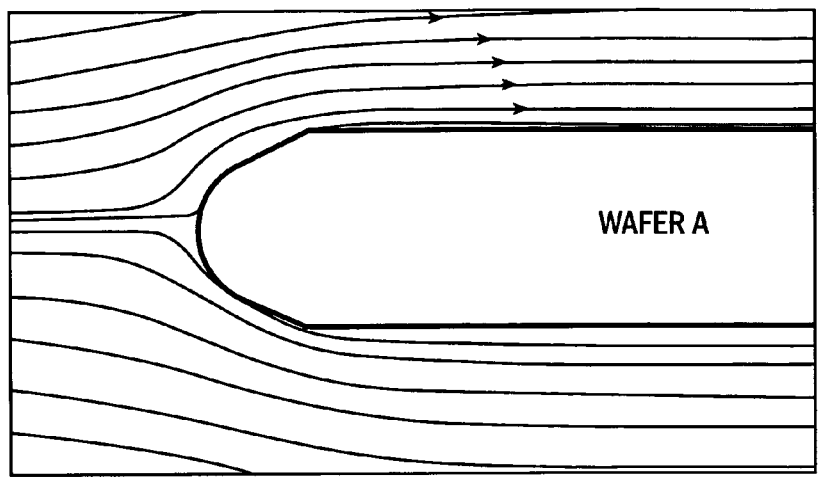
FIG. 4A is a simulated view of fluid flow lines that pass over the peripheral edge of the wafer of FIG. 3A during cleaning or rinsing.
Figure 4B:
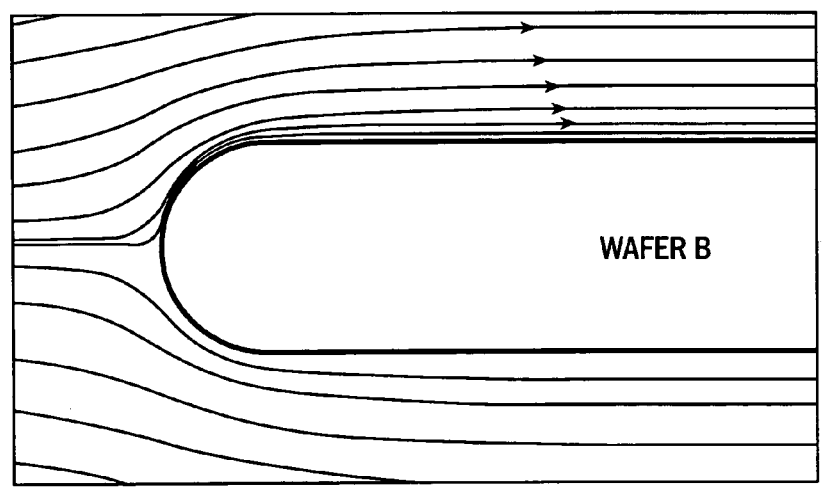
FIG. 4B is a simulated view of fluid flow lines that pass over the peripheral edge of the wafer of FIG. 3B during cleaning or rinsing.
Figure 4C:
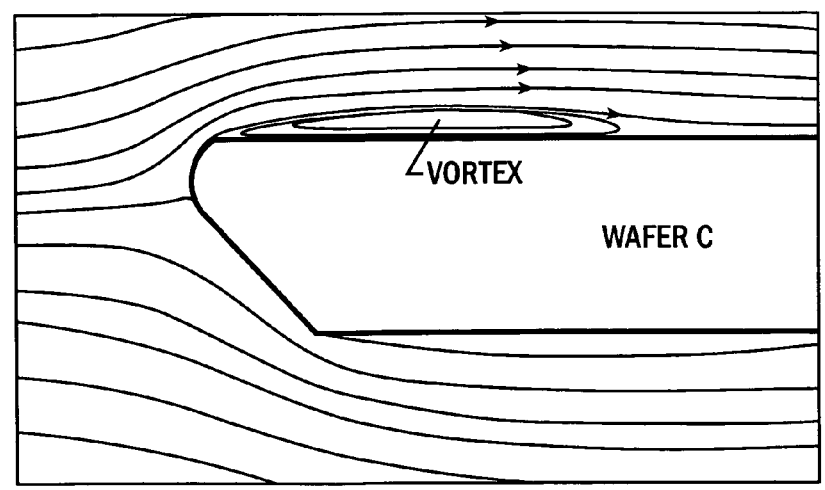
FIG. 4C is a simulated view of fluid flow lines that pass over the peripheral edge of the wafer of FIG. 2 during cleaning or rinsing.

The formation of a vortex during processing is best illustrated by FIG. 4C, where the label "WAFER C" corresponds to a wafer having the edge profile illustrated by FIG. 2. In particular, FIG. 4C is a simulated view of fluid flow lines that pass over the peripheral edge of the wafer of FIG. 2 during cleaning or rinsing. In contrast, FIGS. 4A-4B are simulated views of fluid flow lines that pass over the peripheral edges of the wafers of FIGS. 3A (WAFER A) and 3B (WAFER B) during cleaning or rinsing. These fluid flow lines in FIGS. 4A-4B demonstrate the absence of a protective vortex. The conventional wafers of FIGS. 3A and 3B have symmetric edge profiles where $A_1=A_2$ and $B_1=B_2$.

Other embodiments of the present invention include forming a semiconductor wafer by slicing a semiconductor ingot into at least one semiconductor wafer having a top surface and a bottom surface and then grinding a peripheral edge of the at least one semiconductor wafer to define the asymmetric edge profile (EP) illustrated by FIG. 1. A top surface polishing step may then be performed to convert the edge profile (EP) of FIG. 1 into the edge profile (EP2) of FIG. 2. Alternatively, the step of grinding the peripheral edge may directly result in an edge profile as illustrated by FIG. 2.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor wafer having an asymmetric edge profile (EP) extending between an inner edge profile ($EP_{in}$) and an outer edge profile ($EP_{out}$) as illustrated by FIG. 1, which is incorporated herein;

wherein t is a thickness of the semiconductor wafer, $\phi_1$ is an angle in a range between about 30° and about 85°, R is a radius of an arc that defines $EP_{in}$ at a point of intersection with a top surface of the semiconductor wafer, and $\alpha$ is an acute angle that represents an angle of intersection between a bottom surface of the semiconductor wafer and a line that is tangent to the arc at a point on $EP_{out}$; and wherein:

$A_1=R(1-\cos \phi_1)$;

$A_2=R(1-\sin \alpha)+(t-R \sin \phi_1-R\cos \alpha)\cot \alpha$;

$B_1=R \sin \phi_1$; and $B_2=t-R \sin \phi_1$.

2. The wafer of claim 1, wherein R is in a range between about 0.23t and about 0.5t.

3. The wafer of claim 2, wherein $A_2$ is greater than about two times $A_1$.

4. The wafer of claim 2, wherein $\phi_1$ is in a range between about 60° and about 75°.

5. The wafer of claim 2, wherein t is in a range between about 625 μm and about 825 μm.

6. A semiconductor wafer having an asymmetric edge profile (EP2) extending between an inner edge profile ($EP2_{in}$) and an outer edge profile ($EP2_{out}$) as illustrated by FIG. 2, which is incorporated herein;

wherein t is a thickness of the semiconductor wafer, $\phi_1$ is an angle in a range between about 30° and about 85°, $\phi_2$ is greater than $\phi_1$ and less than about 85°, R is a radius of an arc that defines $EP2_{in}$ at a point of intersection with a top surface of the semiconductor wafer, and α is an acute angle that represents an angle of intersection between a bottom surface of the semiconductor wafer and a line that is tangent to the arc at a point on $EP2_{out}$; and wherein:

$A_1 = R(1-\cos \phi_1)$;

$A_2 = R(1-\sin \alpha) + (B_2 - R \cos \alpha)\cot \alpha$;

$B_1 = R \sin \phi_1$; and $B_2 = t - R \sin \phi_1$.

* * * * *